United States Patent
Shen et al.

(10) Patent No.: US 6,812,083 B2
(45) Date of Patent: Nov. 2, 2004

(54) FABRICATION METHOD FOR NON-VOLATILE MEMORY

(75) Inventors: Shih-Jye Shen, Hsin-Chu (TW); Wei-Zhe Wong, Tai-Nan (TW); Ming-Chou Ho, Hsin-Chu (TW); Hsin-Ming Chen, Hsin-Ying (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 10/463,610

(22) Filed: Jun. 18, 2003

(65) Prior Publication Data
US 2004/0121535 A1 Jun. 24, 2004

(30) Foreign Application Priority Data
Dec. 18, 2002 (TW) .................................. 91136578 A

(51) Int. Cl.⁷ ............................................. H01L 21/336
(52) U.S. Cl. ........................ 438/205; 438/258; 438/266
(58) Field of Search ................................. 438/205, 462, 438/266, 241, 258; 257/401, 462

(56) References Cited

U.S. PATENT DOCUMENTS

| 5,089,866 A | * | 2/1992 | Iwasa | 257/69 |
| 5,416,735 A | * | 5/1995 | Onishi et al. | 365/145 |
| 5,596,523 A | * | 1/1997 | Endoh et al. | 365/182 |
| 6,115,285 A | * | 9/2000 | Montanari et al. | 365/185.03 |
| 6,285,592 B1 | * | 9/2001 | Kubota | 365/185.22 |
| 6,444,554 B1 | * | 9/2002 | Adachi et al. | 438/587 |
| 6,504,755 B1 | * | 1/2003 | Katayama et al. | 365/185.15 |
| 6,630,381 B1 | * | 10/2003 | Hazani | 438/260 |
| 6,657,245 B2 | * | 12/2003 | Tanaka et al. | 257/295 |
| 6,678,190 B2 | * | 1/2004 | Yang et al. | 365/185.05 |

FOREIGN PATENT DOCUMENTS

| JP | 06268180 A | * | 9/1994 |
| JP | 08264522 A | * | 10/1996 |
| JP | 2001-110916 A | * | 4/2001 |

* cited by examiner

Primary Examiner—Matthew Smith
Assistant Examiner—Chuong Anh Luu
(74) Attorney, Agent, or Firm—Winston Hsu

(57) ABSTRACT

A fabrication method for a non-volatile memory includes providing a first metal oxide semiconductor (MOS) transistor having a control gate and a second MOS transistor having a source, a drain, and a floating gate. The first MOS transistor and the second MOS transistor are formed on a well. The method further includes biasing the first MOS with a first biasing voltage to actuate the first MOS transistor, biasing the second MOS transistor with a second biasing voltage to enable the second MOS transistor to generate a gate current, and adjusting capacitances between the floating gate of the second MOS transistor and the drain, the source, the control gate, and the well according to voltage difference between the floating gate of the second MOS transistor and the source of the second MOS transistor.

7 Claims, 8 Drawing Sheets

FABRICATION METHOD FOR NON-VOLATILE MEMORY

CROSS REFERENCE TO RELATED APPLICATIONS

BACKGROUND OF INVENTION

1. Field of the Invention

The present invention relates to a fabrication method of a single poly one time programmable non-volatile memory (NVM) cell or a single poly multiple time programmable non-volatile memory cell, and more particularly, to a method allowing an increase in speed of data writing by adjusting coupling capacitors of a metal oxide semiconductor transistor in the NVM cell.

2. Description of the Prior Art

In recent years, because NVM devices can maintain data after power-off and are rewritable, they are used to record long-term data. The read/write speed of a NVM is a reference to judge the quality of the NVM.

Referring to FIG. 1, FIG. 1 is a sectional drawing of a non-volatile memory cell 10 according to the prior art. The NVM cell 10 includes a first PMOS transistor 12 and a second PMOS transistor 14. The first PMOS transistor 12 and the second PMOS transistor 14 are formed on an n-well 16. The second PMOS transistor 14 and the first PMOS transistor 12 are electrically connected serially to the first PMOS transistor 12 sharing a second P$^+$ doped region 20. The first PMOS transistor 12 includes a first P$^+$ doped region 18 used to as a drain, and a control gate 24 made between the first P$^+$ doped region 18 and the second P$^+$ doped region 20 (a source). The second PMOS transistor 14 is a floating gate transistor, and includes the drain 20 (the second P$^+$ doped region 20), a third P$^+$ doped region 22 used as a source, a floating gate 26 made by single layer poly crystal, and a floating gate oxide film 32 between the floating gate 26 and the n-well 16.

Each electrode of the first PMOS transistor 12 and the second PMOS transistor 14 in the NVM cell 10 according to the prior art can be given different voltages to perform different programmable actions (writing data or reading data). For example, referring to FIG. 1, when writing data to the NVM cell 10, a bit line voltage $V_1=0V$ is applied to the P$^+$ doped region 22 of the second PMOS transistor 14, and a word line voltage $V_2=0V$ is applied to the control gate 24. A well voltage $V_3=5V$ is applied to n-well 16 so the floating gate 26 of the second PMOS transistor 14 remains in a floating status, and a source line voltage $V_1=5V$ is applied to the third P$^+$ doped region 18 so the source 18 of the first PMOS transistor 14 and n-well 16 have the same electric potential. At this time, a first P-type channel under the control gate 24 is formed, so that the second P$^+$ doped region 20 and the first P$^+$ doped region 18 have the same electric potential. Because the floating gate 26 of the second PMOS transistor 14 is under a low voltage (for example, 3~4V) according to capacitive coupling effect, a second P-type channel is opened under the floating gate 26. Collision of holes in the second P-type channel generates hot electrons. The hot electrons quickly cross the floating gate oxide film 32 and are trapped in the floating gate 26.

Referring to FIG. 2, FIG. 2 is a graph relating dropout voltage between the floating gate 26 and the source 22 of the NVM cell 10, and the gate current I flowing in the second P-type channel. Solid lines and dotted lines represent different biasing voltages. As in FIG. 2, when dropout voltage $V_{fs}$ is near a threshold voltage $V_{th}$, the gate current I is near the maximum gate current $I_{max}$. The value of the gate current I directly affects speed of writing data (and reading data) to the NVM cell 10. When the dropout voltage $V_{fs}$ between the floating gate 26 and the source 22 of the second PMOS transistor 14 is larger or smaller than the threshold voltage $V_{th}$ of the PMOS transistor 14, which causes the gate current I to flow in the second P-type channel at a rate less than the largest gate current $I_{max}$, the speed in the floating gate 26 of the second PMOS transistor 14 affects data writing to the NVM cell 10. In addition, the value of the threshold voltage $V_{th}$ of the maximum gate current $I_{max}$ is ranging from 0.5V to 1.5V.

SUMMARY OF INVENTION

It is therefore a primary objective of the claimed invention to provide a fabrication method of a single poly one time programmable non-volatile memory cell or a single poly multiple time programmable non-volatile memory cell to solve the above-mentioned problem.

According to the claimed invention, a fabrication method for a metal oxide semiconductor transistor of a NVM includes forming a first doped region, a second doped region, and a third doped region on a well; forming a control gate between the first doped region and the second doped region; forming a floating gate between the second doped region and the third doped region; providing a first biasing voltage between the first doped region and the control gate such that the first doped region and the second doped region are conductive; providing a second biasing voltage between the second doped region and the well, so as to generate a channel current between the second doped region and the third doped region, and generate a gate current; wherein if a voltage difference between the third doped region and the floating gate is smaller than the threshold voltage of the floating gate device, increasing a capacitance between the floating gate and the third doped region to larger than a total capacitance synthesized between the floating gate and the well, the floating gate and the second doped region, and the floating gate and the control gate; or increasing a capacitance between the floating gate and the control gate to larger than a total capacitance synthesized between the floating gate and the third doped region, the floating gate and the well, and the floating gate and the second doped region; wherein if a voltage difference between the third doped region and the floating gate is larger than the threshold voltage of the floating gate device, decreasing the capacitance between the floating gate and the third doped region to smaller than the total capacitance synthesized between the floating gate and the well, the floating gate and the second doped region, and the floating gate and the control gate; and decreasing the capacitance between the floating gate and the control gate to smaller than the total capacitance synthesized between the floating gate and the third doped region, the floating gate and the well, and the floating gate and the second doped region.

It is an advantage of the claimed invention that a single poly one time programmable non-volatile memory cell or a single poly multiple time programmable non-volatile memory cell fabricated according to the claimed invention method can write data faster than the NVM cell made according to the prior art.

These and other objectives of the claimed invention will not doubt become obvious to those of ordinary skill in the art after reading the following detailed description of the preferred embodiment that is illustrated in the various figures and drawings.

From FIG. 8A to FIG. 8D are a equivalent circuit schematic of the NVM cell according to the present invention after adjusting a coupling capacitor of the second MOS transistor when less floating gate potential is required.

DETAILED DESCRIPTION

Figure 1:
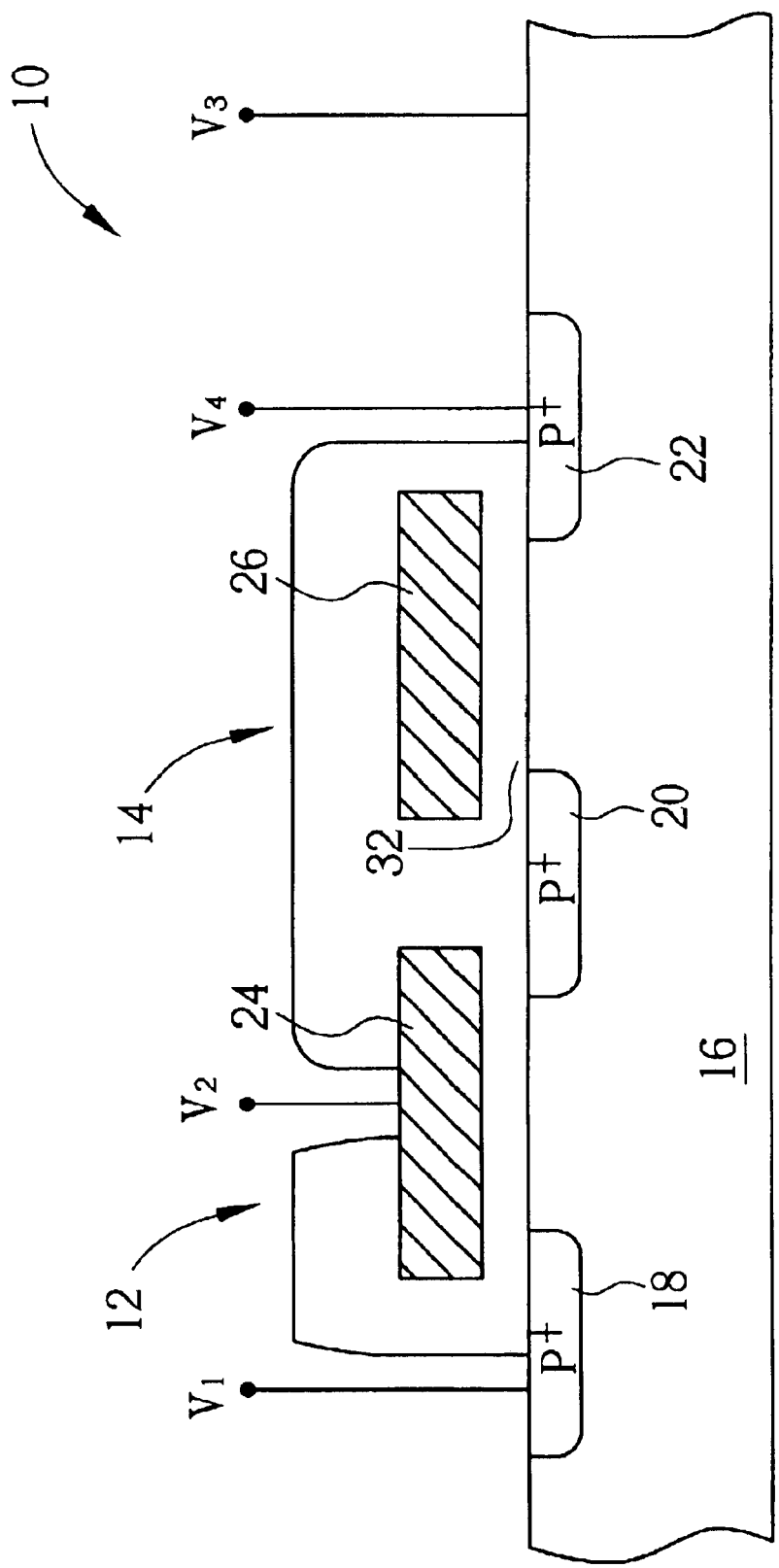
FIG. 1 is a sectional drawing of a NVM cell according to the prior art.
Figure 2:
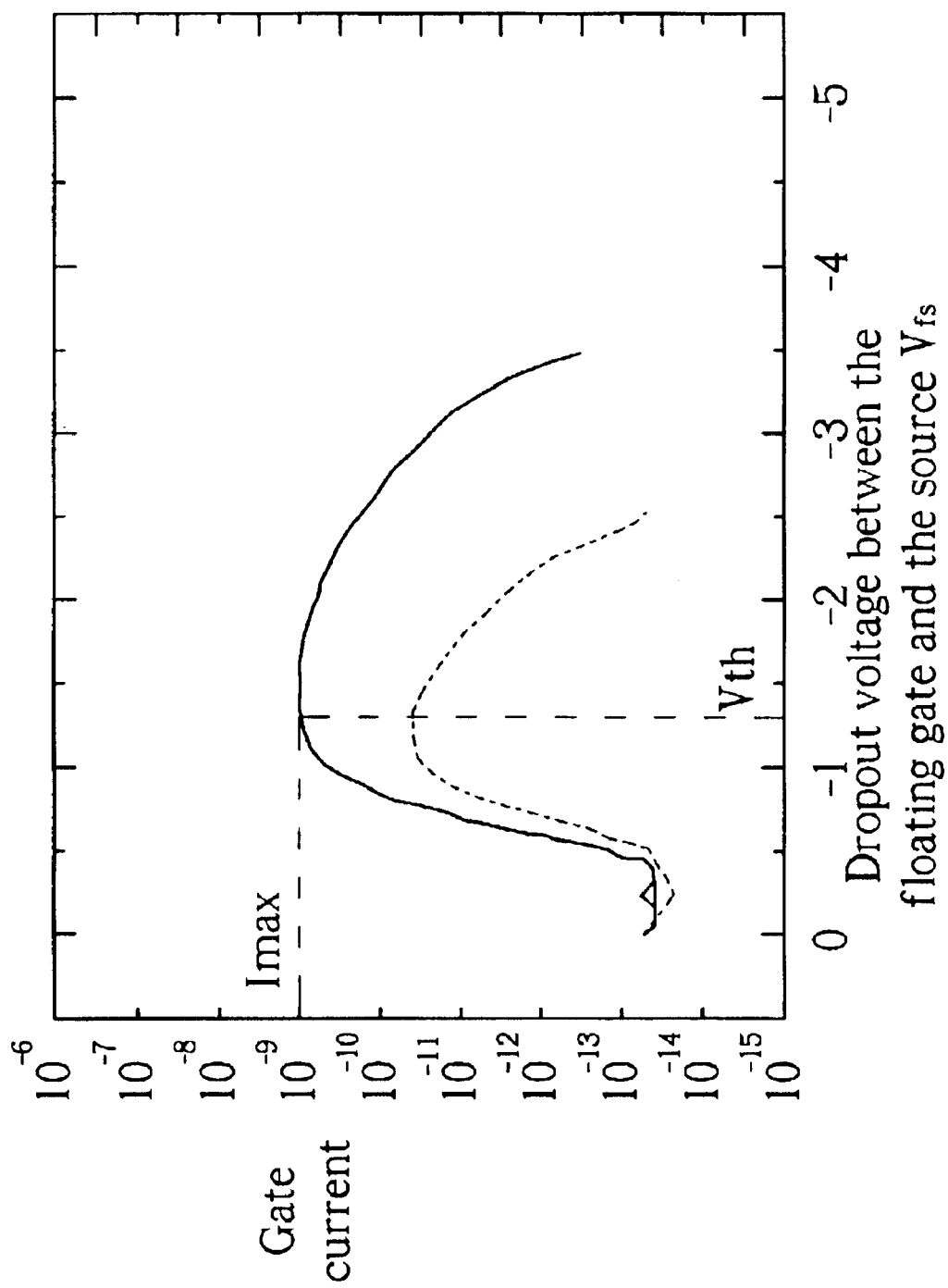
FIG. 2 is a graph relating voltage of a floating gate and gate current in the metal oxide semiconductor transistor of the NVM cell of FIG. 1.
Figure 3:
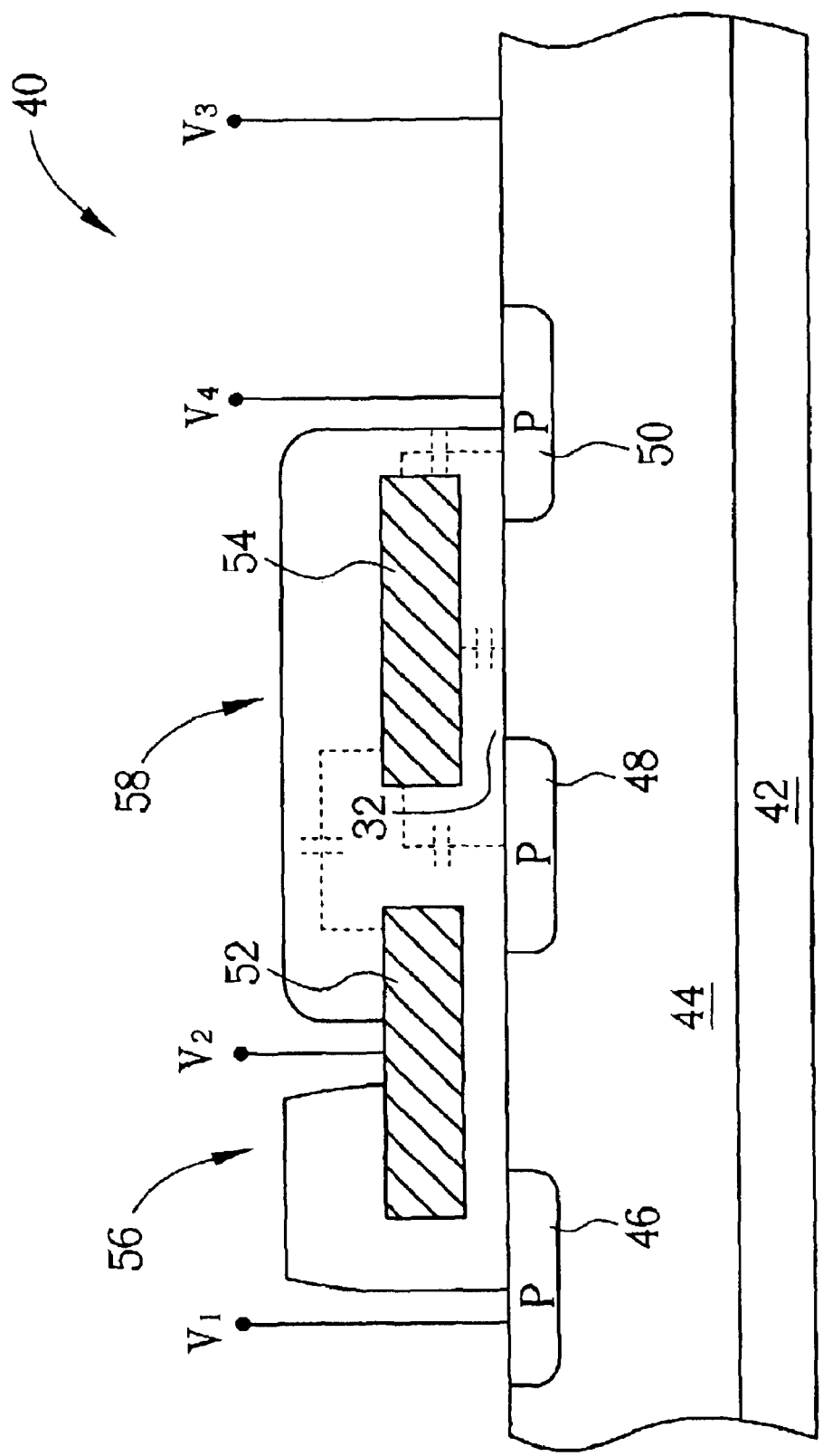
FIG. 3 is a sectional drawing of a NVM cell according to the present invention.

Referring to FIG. 3, FIG. 3 is a sectional view of a NVM cell 40 according to the present invention. The NVM cell 40 includes a P-type semiconductor substrate 42, a well 44, a first doped region 46, a second doped region 48, a third doped region 50, a control gate 52, and a floating gate 54. The well 44 is formed on the P-type semiconductor substrate 42. The well 44, the first doped region 46, the second doped region 48, and the control gate 52 form a first MOS transistor 56. The well 44, the second doped region 48, the third doped region 50, and the floating gate 54 form a second MOS transistor 58. The process for writing data to NVM cell 40 according to the present invention is the same as with the NVM cell 10 according to the prior art.

The well 44 can be a p-well or an n-well. If the well 44 is an n-well the first doped region 46, the second doped region 48, and the third doped region 50 are P$^+$ doped regions; the n-well 44, the first doped region 46, the second doped region 48, and the control gate 52 form a PMOS transistor; and the n-well 44, the second doped region 48, the third doped region 50, and the floating gate 54 from another PMOS transistor. However, if the well 44 is a p-well the first doped region 46, the second doped region 48, and the third doped region 50 are N$^+$ doped regions; the p-well 44, the first doped region 46, the second doped region 48, and the control gate 52 form a NMOS transistor; and the p-well 44, the second doped region 48, the third doped region 50, and the floating gate 52 form another NMOS transistor.

When the first MOS transistor 56 of the NVM cell 40 is conductive and generates a gate current I from the channel hot electron effect of the floating gate 54 of the second MOS transistor 58, the floating gate 54 of the second MOS transistor 58 generates a coupling voltage $V_f$. The value of the coupling voltage $V_f$ relates to the voltages of the well 44, the second doped region 48, the third doped region 50, and the control gate, that is $V_f = \alpha_{fw} V_w + \alpha_{fs} V_s + \alpha_{fd} V_d + \alpha_{fc} V_c$. $V_w$ is voltage of the well 44, Vs is voltage of the second doped region 48, $V_d$ is voltage of the third doped region 50, $V_c$ is voltage of the control gate 52, and $\alpha_{fw}$, $\alpha_{fs}$, $\alpha_{fd}$, $\alpha_{fc}$ are coupling ratios. The coupling ratio is a coupling level from each $V_w$, $V_s$, $V_d$, $V_c$ to $V_f$. That is, $V_w$, $V_s$, $V_d$, $V_c$ is a voltage volume provided to $V_f$.

The value of the coupling ratio $\alpha_{fs}$ relates to the coupling capacitor that the NVM cell 40 generates when the NVM cell 40 is conductive. That is, a coupling ratio $\alpha_{fs} = C_{fd}/(C_{fs} + C_{fd} + C_{fw} + C_{fc})$. Please refer to FIG. 3, the dotted lines in FIG. 3 represent the coupling capacitor $C_{fs}$ generated between the floating gate 54 and the second doped region 48, the coupling capacitor $C_{fd}$ generated between the floating gate 52 and the third doped region 50, and the coupling capacitor $C_{fw}$ generated between the floating gate 54 and the control gate 52. The absolute value of the threshold voltage $V_{th}$ is between 0.5 volt and 1.5 volts.

Generally, the third doped region 50 of NVM cell 40 is connected to a bit line BL, and the control gate 52 of NVM cell 40 is connected to a word line WL. When data is to be written to the NVM cell 40, the bit line BL and word line WL of the NVM cell 40 are set to a low voltage (for example, voltage of bit line BL is set to 0V and voltage of word line WL is set to 0V), while the source line voltage $V_1$ and the well 44 are set to a high voltage. Because at this time voltage $V_d$ of the third doped region 50 and voltage $V_c$ of the control gate 52 are smaller than voltage Vs of the second doped region 48 and voltage $V_w$ of the well 44, if the |Vf–Vs| features a smaller value than the threshold voltage Vth of the floating gate device, the method increases $\alpha_{fd}$ or $\alpha_{fc}$ to increase |Vf–Vs|. In addition, increments of $\alpha_{fd}$ or $\alpha_{fc}$ are larger than increments of $\alpha_{fs}$ and $\alpha_{fw}$ to increase the value of |Vf–Vs|. However, if the floating gate 54 features a value of |Vf–Vs| that is larger than the threshold voltage $V_{th}$, $\alpha_{fs}$ and $\alpha_{fw}$ are increased to increase the coupling voltage $V_f$, and increments of $C_{fd}$ or Cfc are smaller than increments of $C_{fs}$ or $C_{fw}$ so as to reduce coupling voltage $V_f$.

Figure 4:
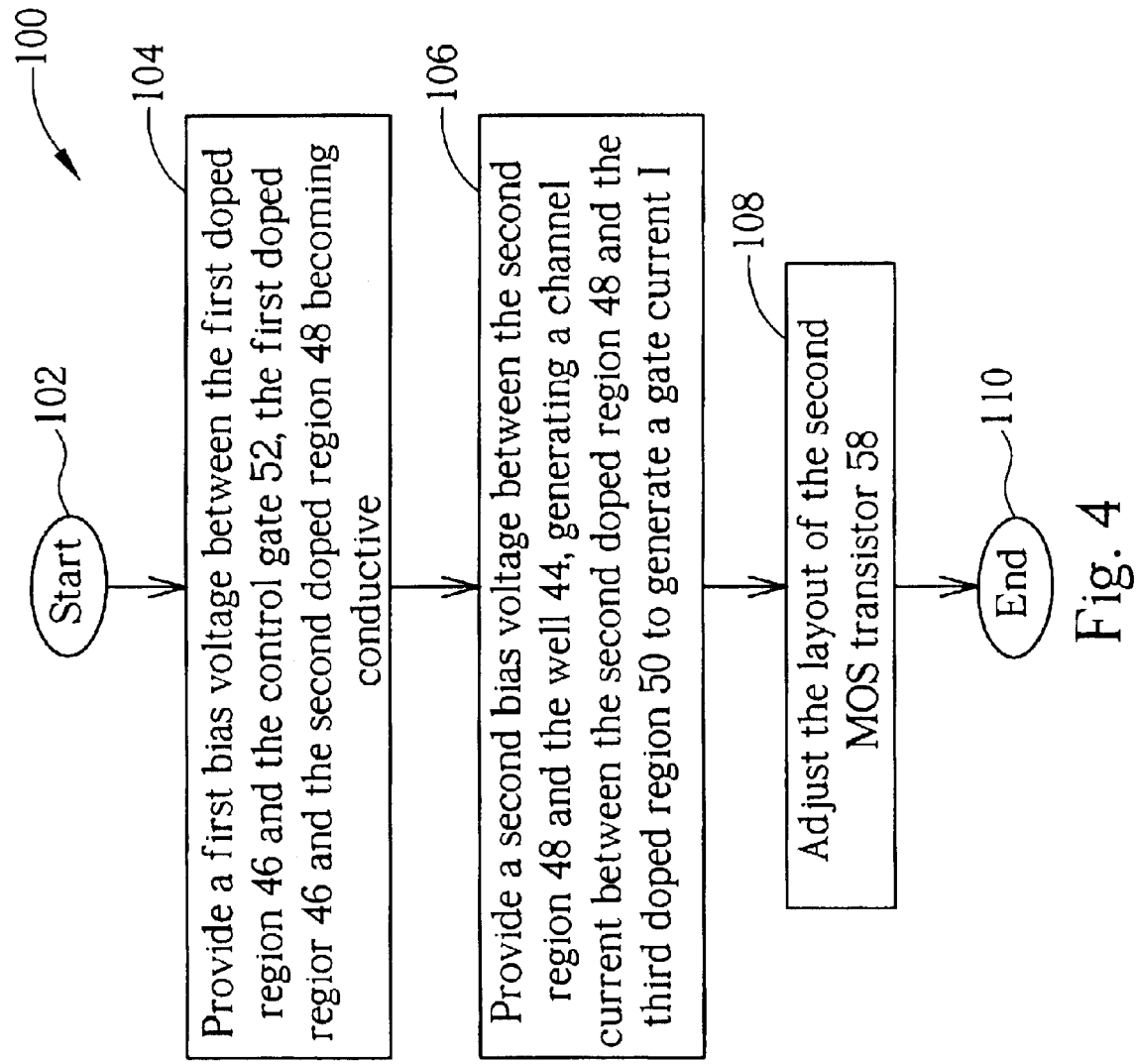
FIG. 4 is a flowchart according to the present invention.

FIG. 4 presents a method of the NVM cell 40 according to the present invention. A flow chart 100 of FIG. 4 includes the following steps:

Step 102: Start. At this time, the base form of NVM cell 40 is formed. Two PMOS transistors or two NMOS transistors are formed by general semiconductor processes on the P-type semiconductor base;

Step 104: Provide a first bias voltage between the first doped region 46 and the control gate 52, the first doped region 46 and the second doped region 48 becoming conductive (the first bias voltage is larger than the start voltage of the first MOS transistor);

Step 106: Provide a second bias voltage between the second doped region 48 and the well 44, generating a channel current between the second doped region 48 and the third doped region 50 to generate a gate current I (the magnitude of the second bias voltage is not important if it can generate gate current I of the second MOS transistor, because threshold voltage $V_{th}$ does not change with second bias);

Step 108: Considering the relationship of dropout voltage and threshold voltage $V_{th}$ between the floating gate 54 and the third doped region 50, adjust the layout of the second MOS transistor 58. If a voltage difference between the third doped region 50 and the floating gate 54 is smaller than the threshold voltage $V_{th}$, increase a capacitance between the floating gate 54 and the third doped region 50 to larger than a total capacitance synthesized between the floating gate 54 and the N-type well 44, the floating gate 54 and the second doped region 48, and the floating gate 54 and the control gate 52; or increase a capacitance between the floating gate 54 and the control gate 52 to larger than a total capacitance synthesized between the floating gate 54 and the third doped region 50, the floating gate 54 and the well 44, and the floating gate 54 and the second doped region 48. If a voltage difference between the third doped region 50 and the floating gate 54 is larger than the threshold voltage $V_{th}$, increase a capacitance between the floating gate 54 and the third doped region 50 to smaller than a total capacitance synthesized between the floating gate 54 and the N-type well 44, the floating gate 54 and the second doped region 48, and the floating gate 54 and control gate 52; and increase a capacitance between the floating gate 54 and the control gate 52 to smaller than a total capacitance synthesized between the floating gate 54 and the third doped region 50, the floating gate 54 and the well 44, and the floating gate 54 and the second doped region 48;

Step 110: End. When NVM cell 40 is to store data data, the bit line BL or word line WL of the NVM cell 40 will be set to a high voltage, the first MOS transistor 56 is conductive, the second transistor 58 generates the gate current I, the floating gate 54 of the second MOS transistor 58 is near the threshold voltage $V_{th}$, and the gate current I is near the maximum gate current $I_{max}$.

Step 108 can be continually executed until the voltage difference between the floating gate 54 and the third doped region 50 becomes suitably close to the threshold voltage $V_{th}$.

Figure 5A:
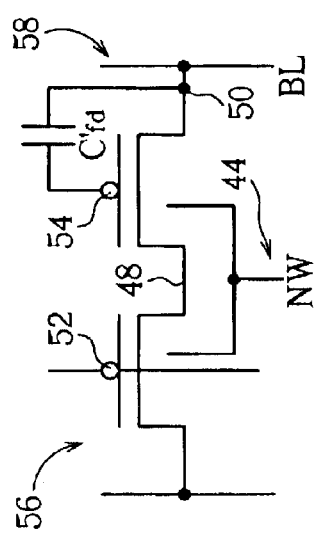
FIG. 5A to FIG. 5F are equivalent circuit schematics of the NVM cell according to the present invention after adjusting a coupling capacitor of the second MOS transistor when more floating gate potential is required.
Figure 5B:
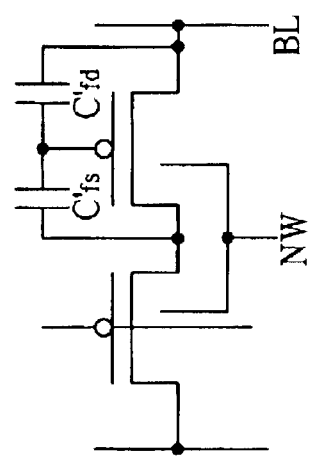
Figure 5C:
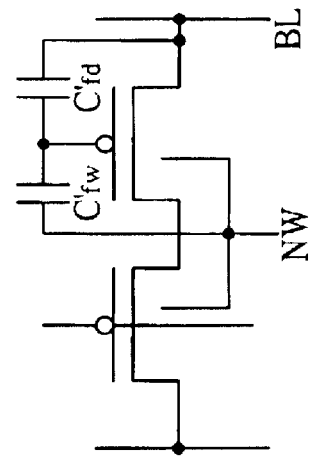
Figure 5D:
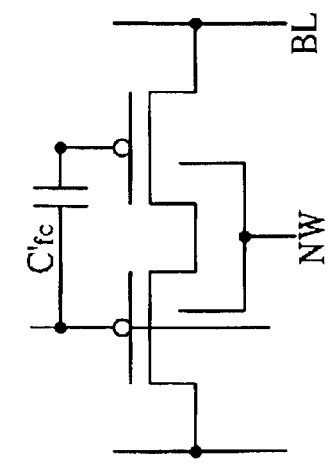
Figure 5E:
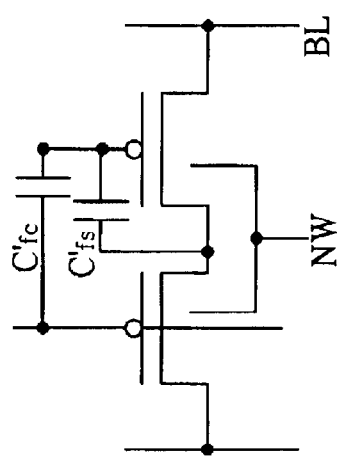
Figure 5F:
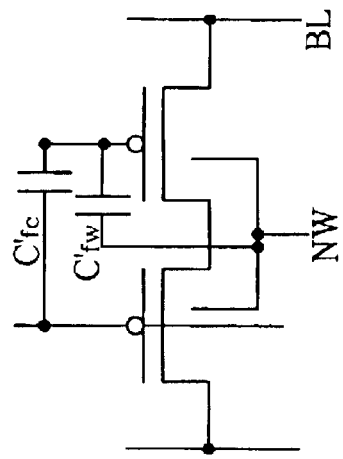

Please refer to FIG. 5A to FIG. 5F. FIG. 5A to FIG. 5F apply the method according to the present invention when the voltage difference between the floating gate 54 and the p⁺ node 48 of the second MOS transistor 58 of the NVM cell 40 is smaller than the threshold voltage $V_{th}$. Equivalent circuit schematics of the NVM cell 40 after adjusting the coupling capacitor of the second MOS transistor 58 of NVM 40 are presented. The first MOS transistor 56 and the second MOS transistor 58 are PMOS transistors, the well 44 is an N-type well, the control gate 52 of the first MOS transistor 56 is electrically connected to the word line WL. $C_{fd}'$ in FIG. 5B is larger than $C_{fs}'$, $C_{fd}'$ in FIG. 5C is larger than $C_{fw}'$, $C_{fc}'$ in FIG. 5E is larger than $C_{fs}'$, and $C_{fc}'$ in FIG. 5F is larger than $C_{fw}'$.

Figure 6A:
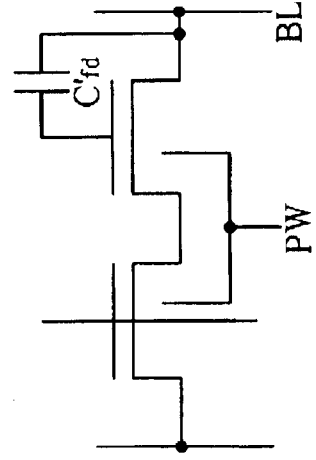
FIG. 6A to FIG. 6F are equivalent circuit schematics of the NVM cell according to the present invention after adjusting a coupling capacitor of the second MOS transistor when more floating gate potential is required.
Figure 6B:
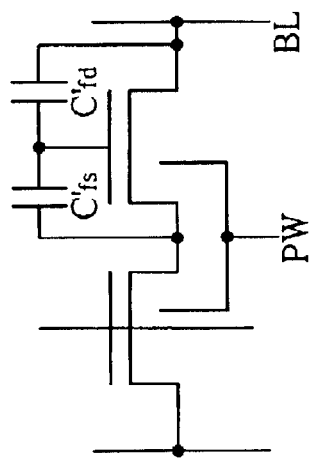
Figure 6C:
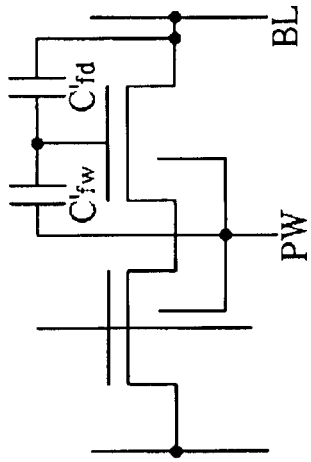
Figure 6D:
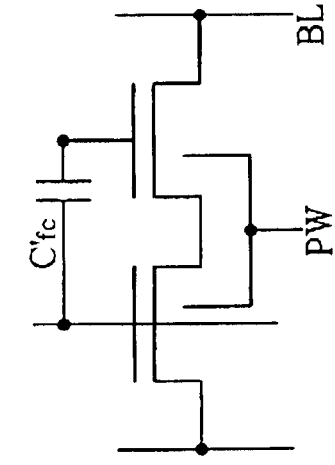
Figure 6E:
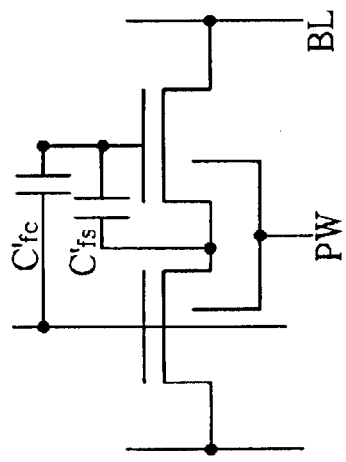
Figure 6F:
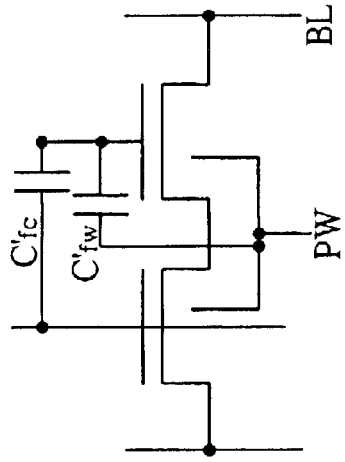

Please refer to FIG. 6A to FIG. 6F. FIG. 6A to FIG. 6F apply the method according to the present invention when the voltage difference between the floating gate 54 and the p⁺ node 48 of the second MOS transistor 58 of the NVM cell 40 is smaller than the threshold voltage $V_{th}$. Equivalent circuit schematics of the NVM cell 40 after adjusting the coupling capacitor of the second MOS transistor 58 of the NVM 40 are presented. The first MOS transistor 56 and the second MOS transistor 58 are NMOS transistors, the well 44 is a P-type well, $C_{fd}'$ in FIG. 6B is larger than $C_{fs}'$, $C_{fd}'$ in FIG. 6C is larger than $C_{fw}'$, $C_{fc}'$ in FIG. 6E is larger than $C_{fs}'$, and $C_{fc}'$ in FIG. 6F is larger than $C_{fw}'$.

Figure 7B:
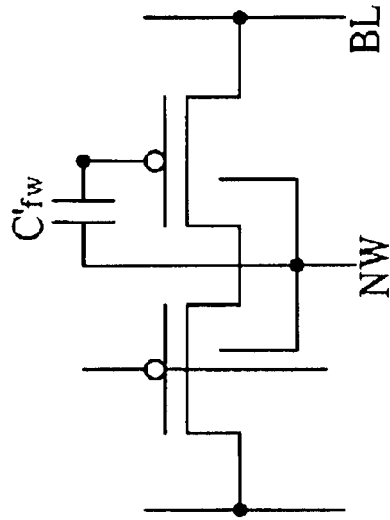
FIG. 7A to FIG. 7D are equivalent circuit schematics of the NVM cell according to the present invention after adjusting a coupling capacitor of the second MOS transistor when $_{less}$ floating gate potential is required.
Figure 7D:
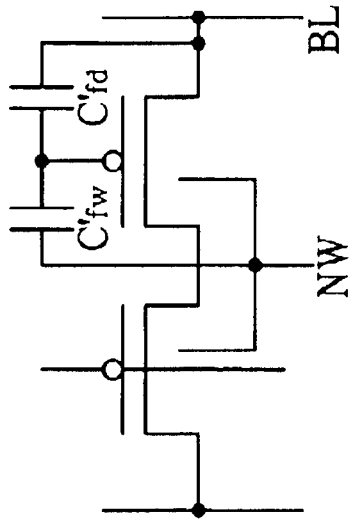
Figure 7A:
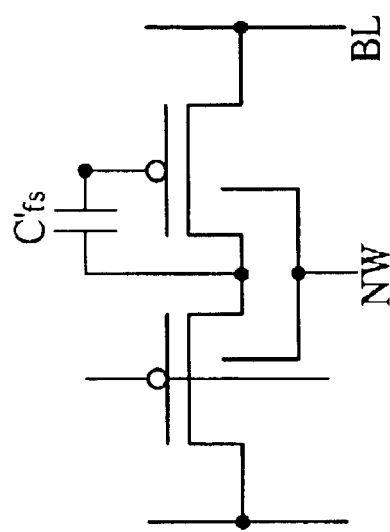
Figure 7C:
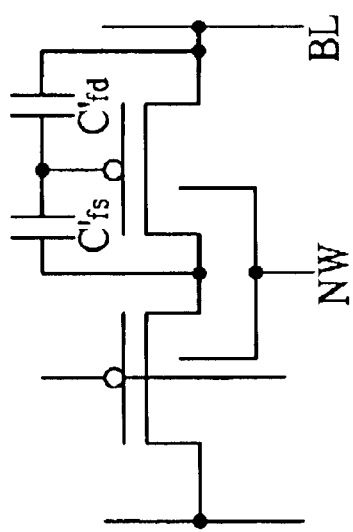

Please refer to FIG. 7A to FIG. 7D. FIG. 7A to FIG. 7D apply the method according to the present invention when the voltage difference between the floating gate 54 and the p⁺ node 48 of the second MOS transistor 58 of the NVM cell 40 is larger than the threshold voltage $V_{th}$. Equivalent circuit schematics of the NVM cell 40 after adjusting a coupling capacitor of the second MOS transistor of the NVM 40 are presented. The first MOS transistor 56 and the second MOS transistor 58 are PMOS transistors, the well 44 is a N-type well, the control gate 52 of the first MOS transistor 56 is connected to the word line WL, the floating gate 54 of the second MOS transistor 58 is connected to the bit line BL. $C_{fd}'$ in FIG. 7C is smaller than $C_{fs}'$ and $C_{fd}'$ in FIG. 7D is smaller than $C_{fw}'$.

Figure 8A:
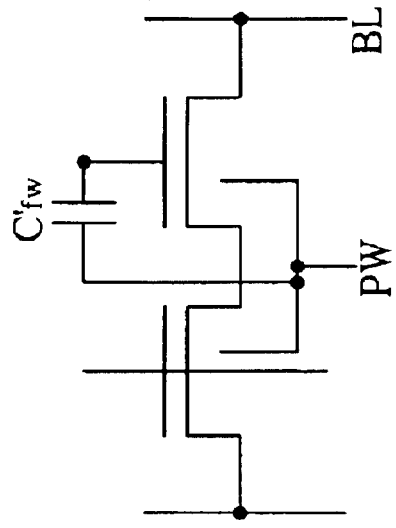
Figure 8B:
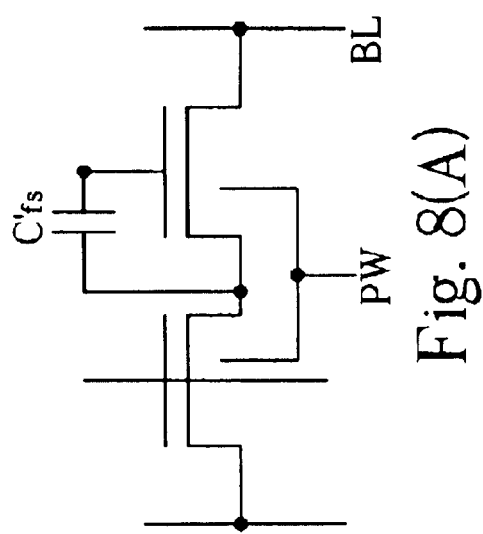
Figure 8C:
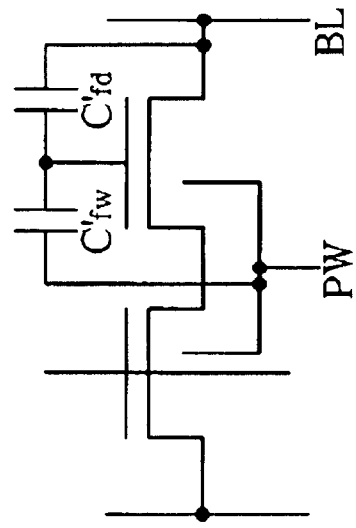
Figure 8D:
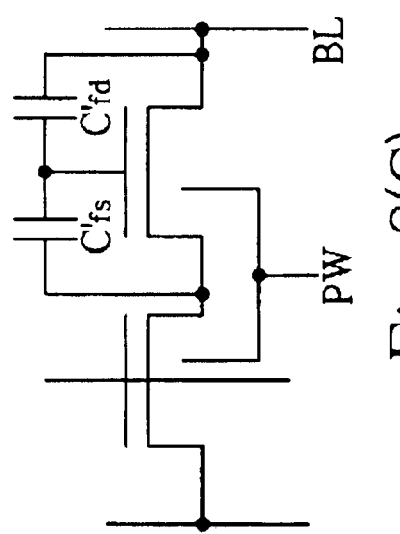

Please refer to FIG. 8A to FIG. 8D. FIG. 8A to FIG. 8D apply the method according to the present invention when the voltage difference between the floating gate 54 and the p⁺ node 48 of the second MOS transistor 58 of the NVM cell 40 is larger than the threshold voltage $V_{th}$. Equivalent circuit schematics of the NVM cell 40 after adjusting the coupling capacitor of the second MOS transistor 58 of the NVM 40 are presented. The first MOS transistor 56 and the second MOS transistor 58 are NMOS transistors, the well 44 is a P-type well, $C_{fd}'$ in FIG. 8C is smaller than $C_{fs}'$, and $C_{fd}'$ in FIG. 8D is smaller than $C_{fw}'$.

Compared with the method of the NVM cell 10 according to the prior art, the method of the NVM cell 40 according to the present invention makes the gate current I of the second MOS transistor 58 near the largest gate current $I_{max}$, and accordingly, the writing speed of the NVM cell 40 according to the present invention is faster than the writing speed of the NVM cell 10 according to the prior art. The method according to the present invention uses well-known semiconductor processes to fabricate the NVM cell 40.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A fabrication method for a metal oxide semiconductor transistor of a non-volatile memory, the method comprising:

forming a first doped region, a second doped region and a third doped region on a well;

forming a control gate between the first doped region and the second doped region;

forming a floating gate between the second doped region and the third doped region;

providing a first biasing voltage between the first doped region and the control gate such that the first doped region and the second doped region are conductive;

providing a second biasing voltage between the second doped region and the well, so as to generate a channel current between the second doped region and the third doped region, and generate a gate current;

wherein if a voltage difference between the third doped region and the floating gate is smaller than a value of a threshold voltage of the metal-oxide-semiconductor transistor, increasing a capacitance between the floating gate and the third doped region to larger than a total capacitance synthesized between the floating gate and the well, the floating gate and the second doped region, and the floating gate and the control gate; or increasing a capacitance between the floating gate and the control gate to larger than a total capacitance synthesized between the floating gate and the third doped region, the floating gate and the well, and the floating gate and the second doped region;

wherein if a voltage difference between the third doped region and the floating gate is larger than the threshold voltage, decreasing the capacitance between the floating gate and the third doped region to smaller than the total capacitance synthesized between the floating gate and the well, the floating gate and the second doped region, and the floating gate and the control gate; and decreasing the capacitance between the floating gate and the control gate to smaller than the total capacitance synthesized between the floating gate and the third doped region, the floating gate and the well, and the floating gate and the second doped region.

2. The method of claim 1 wherein an absolute value of the threshold voltage is between 0.5 volt and 1.5 volts.

3. The method of claim 1 wherein the well is an n-well, and the first doped region, the second doped region, and the third doped region are P+ doped regions.

4. The method of claim 1 wherein the well is a p-well, and the first doped region, the second doped region, and the third doped region are N+ doped regions.

5. The method of claim 1 wherein changes of capacitances between the floating gate and other nodes can be implemented by modifying physical layout.

6. A fabrication method for metal oxide semiconductor transistors of a non-volatile memory, the method comprising:

forming a first doped region, a second doped region and a third doped region on a well;

forming a control gate between the first doped region and the second doped region;

forming a floating gate between the second doped region and third doped region;

providing a first biasing voltage between the first doped region and the control gate such that the first doped region and the second doped region are conductive;

providing a second biasing voltage between the second doped region and the well, so as to generate a channel current between the second doped region and the third doped region, and generate a gate current;

wherein if a difference between the third doped and the floating gate is smaller than a value of a threshold voltage of the metal-oxide-semiconductor transistor, increasing a capacitance between floating gate and the third doped region to larger than a total capacitance synthesized between the floating gate and the well, the floating gate and the second doped region, and the floating gate and the control gate; or increasing a capacitance between the floating gate and control gate to larger than a total capacitance synthesized between the floating gate and the third doped region, the floating gate and the well and the floating gate and second doped region; wherein the well is an n-well, and the first doped region, the second doped region, and the third doped region are P+ doped region and further comprising providing a P-type substrate; the n-well, the first doped region, the second doped region, and control gate forming PMOS transistor; the n-well, the second doped region, the third doped region, floating gate forming another PMOS transistor.

7. A fabrication method for metal oxide semiconductor transistors of a non-volatile memory, the method comprising:

forming a first doped region, a second doped region and a third doped region on a well;

forming a control gate between the first doped region and the second doped region;

forming a floating gate between the second doped region and the third doped region;

providing a first biasing voltage between the first doped region and the control gate such that the first doped region and the second doped region are conductive;

providing a second biasing voltage between the second doped region and the well, so as to generate a channel current between the second doped region and the third doped region, and generate a gate current;

wherein if a difference between the third doped and the floating gate is smaller than a value of a threshold voltage of the metal-oxide-semiconductor transistor, increasing a capacitance between floating gate and the third doped region to larger than a total capacitance synthesized between the floating gate and the well, the floating gate and the second doped region, and the floating gate and the control gate; or increasing a capacitance between the floating gate and control gate to larger than a total capacitance synthesized between the floating gate and the third doped region, the floating gate and the well and the floating gate and second doped region; wherein the well a p-well, and the first doped region, the second doped region, and the third doped region are N+ doped region; and further comprising providing a P-type substrate; the p-well, the first doped region, the second doped region, and the control gate forming an NMOS transistor; the p-well, the second doped region, the third doped region, and the floating gate forming another NMOS transistor.

* * * * *